United States Patent
Xu et al.

(10) Patent No.: US 10,852,325 B2
(45) Date of Patent: Dec. 1, 2020

(54) DEVICE FOR DETECTING PHASE LOSS OF OUTPUT IN INVERTER

(71) Applicant: LSIS CO., LTD., Anyang-si (KR)

(72) Inventors: Chengde Xu, Anyang-si (KR); Chun-Suk Yang, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 11 days.

(21) Appl. No.: 16/369,014

(22) Filed: Mar. 29, 2019

(65) Prior Publication Data
US 2019/0346491 A1 Nov. 14, 2019

(30) Foreign Application Priority Data
May 9, 2018 (KR) .................. 10-2018-0052890

(51) Int. Cl.
*G01R 19/145* (2006.01)
*G01R 29/18* (2006.01)
(Continued)

(52) U.S. Cl.
CPC .......... *G01R 19/145* (2013.01); *G01R 29/18* (2013.01); *H02M 7/42* (2013.01); *H02M 2001/0048* (2013.01)

(58) Field of Classification Search
CPC .... H02M 1/00; H02J 1/00; H02H 1/00; H02P 1/00; H02P 2101/00; B60L 1/00; B60L 2200/00
See application file for complete search history.

(56) References Cited

U.S. PATENT DOCUMENTS

2002/0079859 A1* 6/2002 Lumsden ............... H02P 27/02
318/727
2008/0061728 A1* 3/2008 Tomigashi ............ H02M 7/217
318/768
(Continued)

FOREIGN PATENT DOCUMENTS

EP 2874295 A2 5/2015
JP H08223936 A 8/1996
(Continued)

OTHER PUBLICATIONS

European Search Report for related European Application No. 19162679.5; action dated Oct. 8, 2019; (7 pages).
(Continued)

*Primary Examiner* — Jermele M Hollington
*Assistant Examiner* — Temilade S Rhodes-Vivour
(74) *Attorney, Agent, or Firm* — K&L Gates LLP (57) ABSTRACT

Disclosed is a device for detecting a phase loss in an output current in an inverter. The device includes: an output current detection unit for detecting two phases output currents from two signals output from two shunt-resistors connected to two phases legs respectively; an output current calculation unit for calculating an output current of one remaining phase using the detected two phases output currents; and an output phase loss detection unit configured for detecting an output phase loss when the calculated output current is within a current band corresponding to the output phase loss or when the calculated output current has a magnitude equal to and a sign opposite to one of the detected two phases output currents.

5 Claims, 12 Drawing Sheets

(51) Int. Cl.
  *H02M 7/42*  (2006.01)
  *H02M 1/00*  (2006.01)

(56) References Cited

U.S. PATENT DOCUMENTS

| | | | | |
|---|---|---|---|---|
| 2015/0207438 A1* | 7/2015 | Takami | ............... | H02P 29/032 318/400.06 |
| 2015/0214882 A1* | 7/2015 | Suzuki | ............... | B62D 5/049 318/139 |
| 2015/0303844 A1* | 10/2015 | Ajima | ............... | H02M 7/5395 318/400.13 |
| 2018/0062551 A1* | 3/2018 | Moon | ............... | H02P 21/24 |

FOREIGN PATENT DOCUMENTS

| | | | |
|---|---|---|---|
| JP | 2004040921 | A | 2/2004 |
| JP | 2013106424 | A | 5/2013 |
| JP | 2015100260 | A | 5/2015 |
| KR | 101516497 | B1 | 5/2015 |

OTHER PUBLICATIONS

Korean Office Action for related Korean Application No. 10-2018-0052890; action dated Apr. 25, 2019; (5 pages).
Japanese Office Action for related Japanese Application No. 2019-043021; action dated Mar. 24, 2020; (4 pages).

* cited by examiner

| | T0 | T1 | T2 | T0 | | | | |
|---|---|---|---|---|---|---|---|---|
| Sa | 0 | 1 | 1 | 1 | 1 | 1 | 1 | 0 |
| Sb | 0 | 0 | 1 | 1 | 1 | 1 | 0 | 0 |
| Sc | 0 | 0 | 0 | 1 | 1 | 0 | 0 | 0 |

On Sequence | Off Sequence

FIG. 10B

| | T0 | T1 | T2 | T0 | | | | |
|---|---|---|---|---|---|---|---|---|
| Sa | 0 | 0 | 1 | 1 | 1 | 1 | 0 | 0 |
| Sb | 0 | 1 | 1 | 1 | 1 | 1 | 1 | 0 |
| Sc | 0 | 0 | 0 | 1 | 1 | 0 | 0 | 0 |

On Sequence | Off Sequence

FIG. 10C

|    | T0 | T1 | T2 | T0 |   |   |   |   |
|----|----|----|----|----|---|---|---|---|
| Sa | 0  | 0  | 0  | 1  | 1 | 0 | 0 | 0 |
| Sb | 0  | 1  | 1  | 1  | 1 | 1 | 1 | 0 |
| Sc | 0  | 0  | 1  | 1  | 1 | 1 | 0 | 0 |

On Sequence | Off Sequence

FIG. 10D

|    | T0 | T1 | T2 | T0 |   |   |   |   |
|----|----|----|----|----|---|---|---|---|
| Sa | 0  | 0  | 0  | 1  | 1 | 0 | 0 | 0 |
| Sb | 0  | 0  | 1  | 1  | 1 | 1 | 0 | 0 |
| Sc | 0  | 1  | 1  | 1  | 1 | 1 | 1 | 0 |

On Sequence | Off Sequence

DEVICE FOR DETECTING PHASE LOSS OF OUTPUT IN INVERTER

CROSS-REFERENCE TO RELATED APPLICATION

Pursuant to 35 U.S.C. § 119(a), this application claims the benefit of earlier filing date and right of priority to Korean Application No. 10-2018-0052890, filed on May 9, 2018, in the Korean Intellectual Property Office, the disclosure of which is incorporated herein in its entirety by reference.

TECHNICAL FIELD

The present disclosure relates to a device for detecting a phase loss of an output in an inverter.

BACKGROUND

Generally, an inverter is an inverse conversion device that electrically converts DC to AC. An inverter used in the industry is defined as a series of devices that control a motor speed such that the motor is used with a high efficiency by receiving a power supplied from a commercial power supply and varying a voltage and frequency of the power by itself and supplying the varied power to the motor. The inverter is controlled via a variable voltage variable frequency (VVVF) scheme. The inverter may vary a voltage and frequency input to the motor based on a pulse width modulation (PWM) output.

Figure 1:
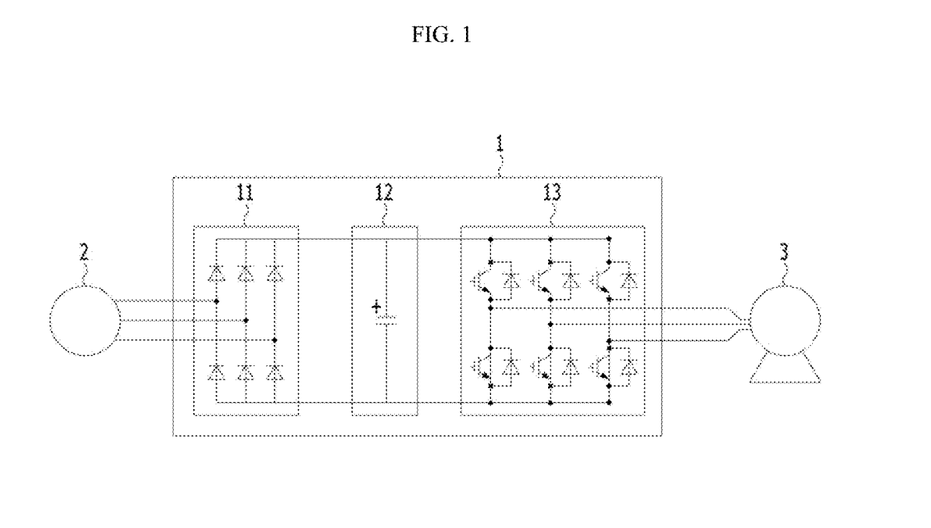
FIG. 1 shows a configuration of a conventional inverter.

FIG. 1 shows a configuration of a conventional inverter.

Generally, an inverter 1 receives AC power of three phases from a power supply 2. Then, a rectifying module 11 in the inverter 1 rectifies the received AC power to DC power. Then, a smoothening module 12 in the inverter 1 smoothens and stores DC voltage from the rectifying module 11. An inverting module 13 in the inverter 1 converts the DC voltage stored in a DC link capacitor as the smoothening module 12 to an AC voltage having a predetermined voltage and frequency according to a PWM control signal. Then, the inverter 1 provides the converted AC voltage to the motor 3. To this end, the inverting module 13 has three legs. Each leg is composed of two switching elements connected in series.

An phase loss of an output of the inverter means that more than one phase of the output of the inverter 1 is open or lost. This phase loss occurs because an output stage of the inverter 1 is not connected to the motor 3, or malfunction of a switching device between the output stage of the inverter 1 and motor 3 occurs.

When the phase loss occurs, the motor 3 may be damaged due to overcurrent exceeding a rated current. Therefore, when the phase loss of the output occurs, the inverter 1 needs to notify a user that the output phase loss has occurred, and then it is necessary for the user to stop an operation of the inverter 1 and safely protect the motor 3. To do this, a device for detecting phase loss of the output of the inverter 1 is required.

Further, because the phase loss of the output causes the inverter to stop operating, an efficiency of the inverter drive may be degraded due to erroneous detection of the phase loss of the output. Therefore, a method for improving an accuracy of detection of the output phase loss needs to be provided.

SUMMARY

In order to solve the problem, a purpose of the present disclosure is to provide a device for detecting phase loss of an output of an inverter at an improved detection accuracy.

The purpose of the present disclosure is not limited to the above-mentioned purposes. Other purposes and advantages of the present disclosure that are not mentioned may be understood by following descriptions, and will be more clearly understood by embodiments of the present disclosure. It is to be further understood that the purposes and advantages of the present disclosure may be realized and attained by means of means and combinations thereof recited in the appended claims.

In one aspect of the present disclosure, there is provided a device for detecting a phase loss in an output current in an inverter, wherein the inverter includes: an inverting module for converting a direct current (DC) link voltage to an alternate current (AC) voltage, wherein the inverting module includes three-phases legs, wherein each leg has lower and upper switching elements connected in series; and a shunt-resistor connected in series with a lower switching element of each leg of the inverting module, wherein the device includes: an output current detection unit for detecting two phases output currents from two signals output from two shunt-resistors connected to two phases legs respectively; an output current calculation unit for calculating an output current of one remaining phase using the detected two phases output currents; and an output phase loss detection unit configured for detecting an output phase loss when the calculated output current is within a current band corresponding to the output phase loss or when the calculated output current has a magnitude equal to and a sign opposite to one of the detected two phases output currents.

In one implementation, the output current detection unit receives sector information corresponding to the output currents from a pulse width modulation (PWM) controller, wherein the controller injects a PWM signal to the switching elements of the inverting module.

In one implementation, when the calculated output current is within the current band corresponding to the output phase loss or when the calculated output current has a magnitude equal to and a sign opposite to one of the detected two phases output currents, the output phase loss detection unit is further configured to increment a phase loss count.

In one implementation, when the calculated output current is above or below the current band corresponding to the output phase loss and when the calculated output current is equal to a sum of the detected two output currents, the output phase loss detection unit is further configured to decrement the phase loss count.

In one implementation, when the phase loss count reaches a predetermined output phase loss determination level, the output phase loss detection unit is further configured to determine that an output phase loss event occurs and to perform an inverter protection operation.

According to the present disclosure, for each sector, one phase current is calculated. Then, it is determined whether the calculated current is within the current band corresponding to the output phase loss. Further, at the same time, even when the calculated output current is above or below the current band corresponding to the output phase loss, it is further determined whether the calculated output current has an opposite sign to one of the other detected output currents and then it is further determined whether the output phase loss event occurs based on the determination. Thus, the quality of the inverter protection operation can be improved and the inverter and thus the load can be protected reliably, thereby improving the reliability of the inverter system.

Further specific effects of the present disclosure as well as the effects as described above will be described in conduction with illustrations of specific details for carrying out the invention.

BRIEF DESCRIPTION OF THE DRAWINGS

FIG. 10A-F show an operation of switching elements on a PWM sector basis.

DETAILED DESCRIPTION

Hereinafter, a device for detecting phase loss in an output of in an inverter in accordance with the present disclosure will be described with reference to the accompanying drawings.

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Embodiments are described in sufficient detail to enable those skilled in the art in the art to easily practice the technical idea of the present disclosure. It is intended to cover alternatives, modifications, and equivalents as may be included within the spirit and scope of the present disclosure as defined by the appended claims.

Unless defined otherwise, all terms used herein have the same meaning as commonly understood by one of ordinary skill in the art. When the terms used herein are in conflict with a general meaning of the term, the meaning of the term is in accordance with a definition used herein.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Hereinafter, an inverter control device and method according to an embodiment of the present disclosure will be described with reference to FIGS. 2A to 5.

Figure 2A:
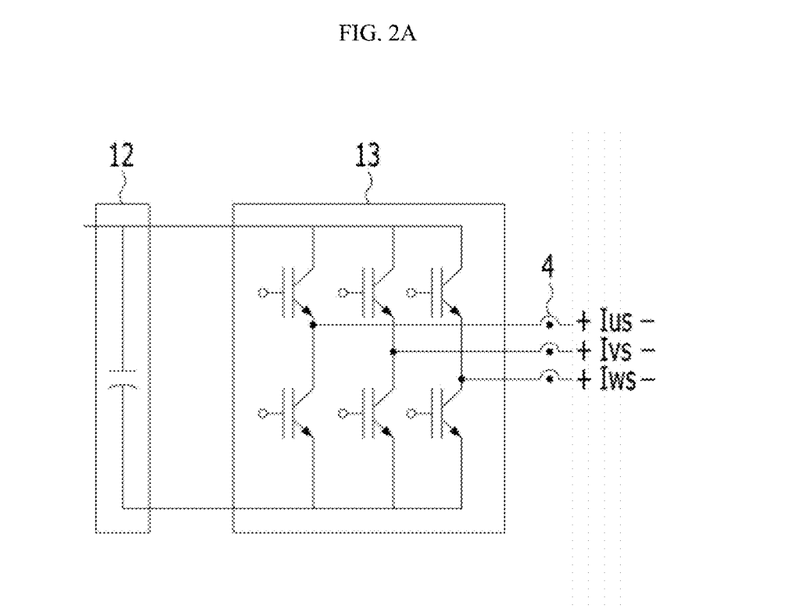
FIG. 2A shows a detection circuit of an output current of an inverter using a current transformer (CT).
Figure 2B:
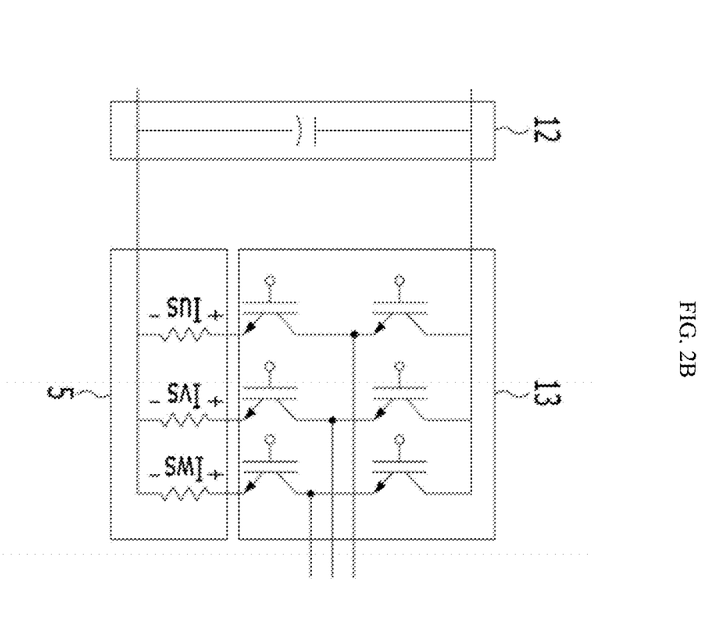
FIG. 2B shows a detection circuit of an output current of an inverter using a shunt-resistor.

FIG. 2A shows a detection circuit of an output current of an inverter using a current transformer (CT). FIG. 2B shows a detection circuit of an output current of an inverter using a shunt-resistor.

Referring to FIG. 2A, a CT 4 is placed on an output of an inverter 1 and detects 3-phases output currents of the inverter 1. The current detection scheme using CT detects the current via isolating the inverting module 13 from a control unit (not shown) of the inverter 1 and does not require a separate isolation circuit. However, since the current detection scheme using CT has a nonlinear region and is relatively expensive compared with the current detection scheme using a shunt-resistor, the current detection scheme using CT is mainly used for an inverter having a class above a standard-class.

Referring to FIG. 2B, a shunt-resistor 5 is connected to an emitter stage of a lower switching element of each leg of the inverting module 13. An output current of the inverter 1 is detected when the current flows through each lower switching element according to an operating state of the switching elements of the inverting module 13.

Figure 3:
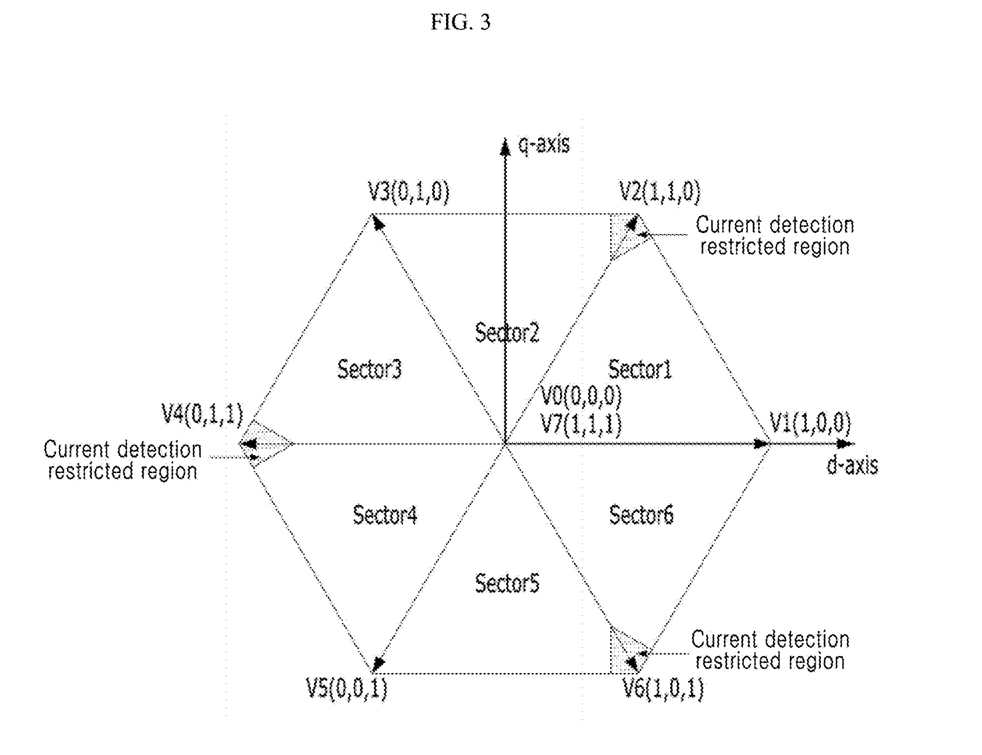
FIG. 3 is a diagram for illustrating an output current detection restricted region according to a pulse width modulation (PWM) state of the inverter.

FIG. 3 is a diagram for illustrating an output current detection restricted region according to a pulse width modulation (PWM) state of the inverter.

As shown in FIG. 3, in the scheme of detecting the output current of the inverter using the shunt-resistor, a region in which the current cannot be detected may occur according to an operation state of the switching elements and a current conduction time duration. Therefore, in order to extend the current detection region, the current detection circuit detects two phases currents out of the three phase output currents and calculates current of one remaining phase. A table below shows how to calculate current on a sector basis in the inverter output current detection scheme using the shunt-resistor.

TABLE 1

| Sector Number | Iu | Iv | Iw |
|---|---|---|---|
| 1 | Iu = Ivs + Iws | Iv = −Ivs | Iw = −Iws |
| 2 | Iu = −Ius | Iv = Ius + Iws | Iw = −Iws |
| 3 | Iu = −Ius | Iv = Ius + Iws | Iw = −Iws |
| 4 | Iu = −Ius | Iv = −Ivs | Iw = Ius + Ivs |
| 5 | Iu = −Ius | Iv = −Ivs | Iw = Ius + Ivs |
| 6 | Iu = Ivs + Iws | Iv = −Ivs | Iw = −Iws |

The scheme of detecting the inverter output current using the shunt-resistor may be implemented at a relatively low cost compared to the scheme of detecting the inverter output current using CT, and thus is mainly used for small-sized low-cost inverters.

Figure 4:
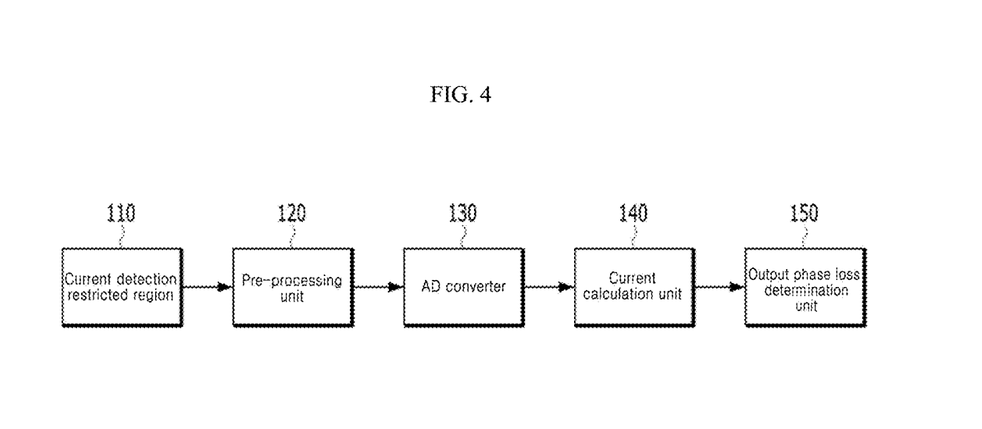
FIG. 4 shows a configuration of a conventional device for detecting phase loss of an output in an inverter.

FIG. 4 shows a configuration of a conventional device for detecting phase loss of an output in an inverter.

An output current input from a shunt-resistor 4 is detected as a current signal input from the shunt-resistor 4 by a current detection unit 110. Then, a pre-processing unit 120 filters a low-band signal from the detected signal and adjusts a scale thereof. Then, an AD converter 130 converts the detected analog signal into digital data. Then, an output current is calculated as shown in Table 1. Thus, phase loss of the output current is determined using the calculated output current.

In this way, the phase loss of the output current may be determined for each phase via receiving the output currents of the three-phases of the inverter respectively. In this case, when the output current of each phase of the inverter is kept within a current band corresponding to the output phase loss for a certain time, it is determined that the output has phase loss. Because no open-phase current flows during the phase loss, the output current is maintained within a set current band corresponding to the output phase loss for a certain time.

Figure 5:
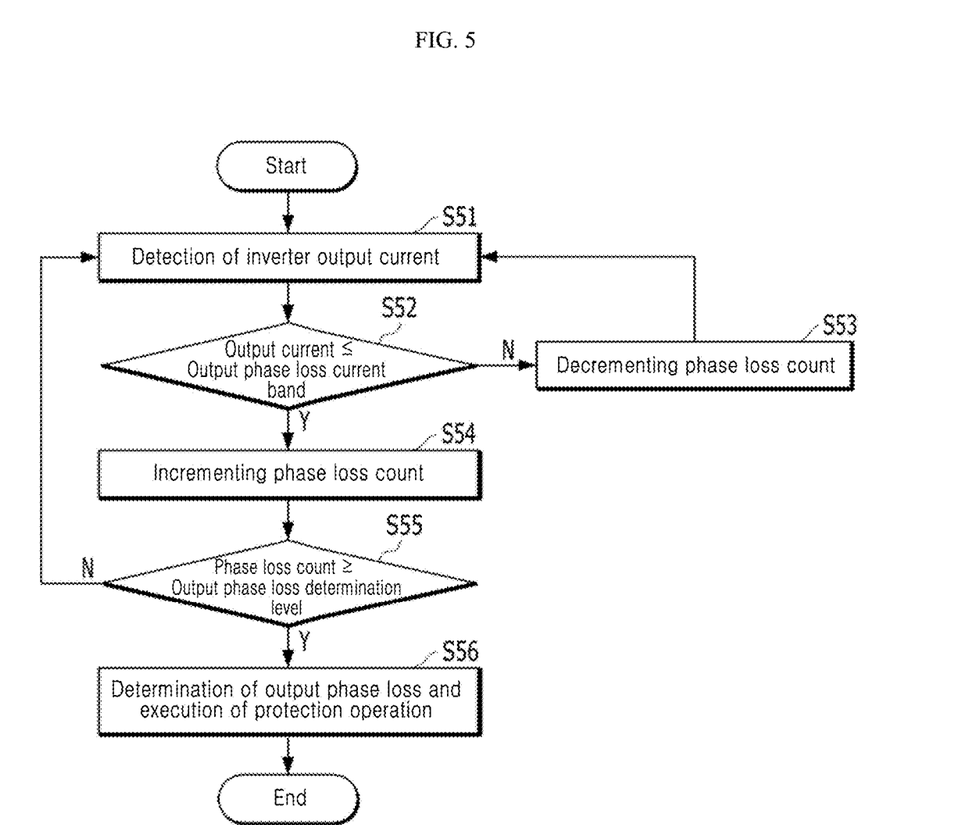
FIG. 5 illustrates a conventional method for detecting phase loss in a inverter output current.

FIG. 5 illustrates a conventional method for detecting phase loss in an inverter output current.

The conventional device for detecting the phase loss of the output as shown in FIG. 4 determines whether the output current is within the current band corresponding to the output phase loss at every detection cycle of the inverter output current S51 and S52. When the inverter output current is within the current band corresponding to the output phase loss, the device increments the phase loss count OPO_Cnt. This process is repeated for each output current detection cycle S54. When the inverter output current is above the current band corresponding to the output phase loss, the device may decrement the phase loss count OPO_Cnt S53 to prevent the phase loss detection of the output in an normal inverter operation.

When an accumulated phase loss count OPO_Cnt is above a count level corresponding to the phase loss detection, phase loss determination unit 150 determines the phase loss of the output, and performs a set protection operation, for example, a trip operation.

Figure 6A:
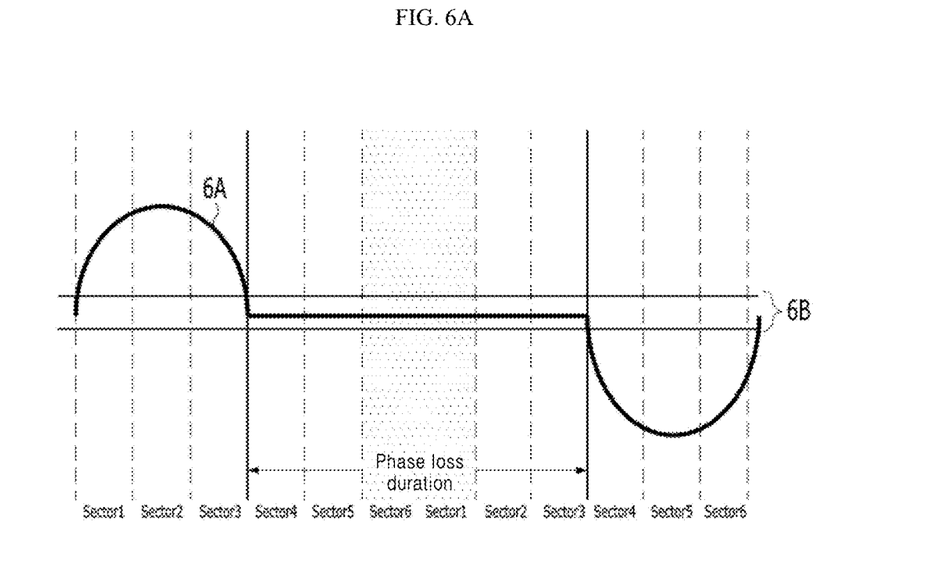
FIG. 6A and FIG. 6B show detection of phase loss in an output current detection scheme using CT.
Figure 6B:
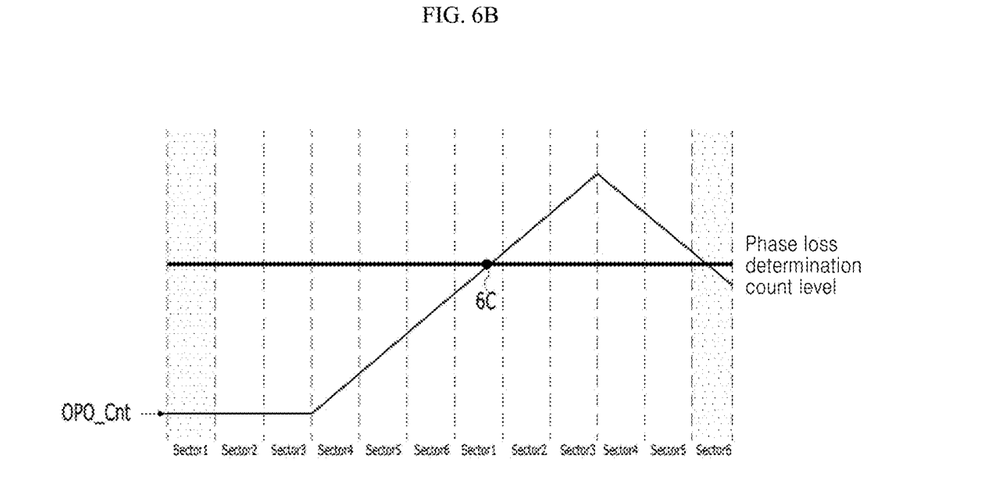

FIG. 6A and FIG. 6B show detection of phase loss in an output current detection scheme using CT when one phase of the 3 phases inverter output currents has phase loss in a single cycle. When the inverter output current 6A is within the current band 6B corresponding to the output phase loss, the phase loss count is incremented. When the accumulated phase loss count reaches the count level 6C corresponding to the phase loss detection, the phase loss is detected.

However, in the current detection scheme using a shunt-resistor, the output current of one phase is calculated by detecting effective two-phases output currents among the three-phases inverter output currents on a PWM sector basis. As a result, there occurs a problem that the phase loss of the output current cannot be detected accurately.

Figure 7A:
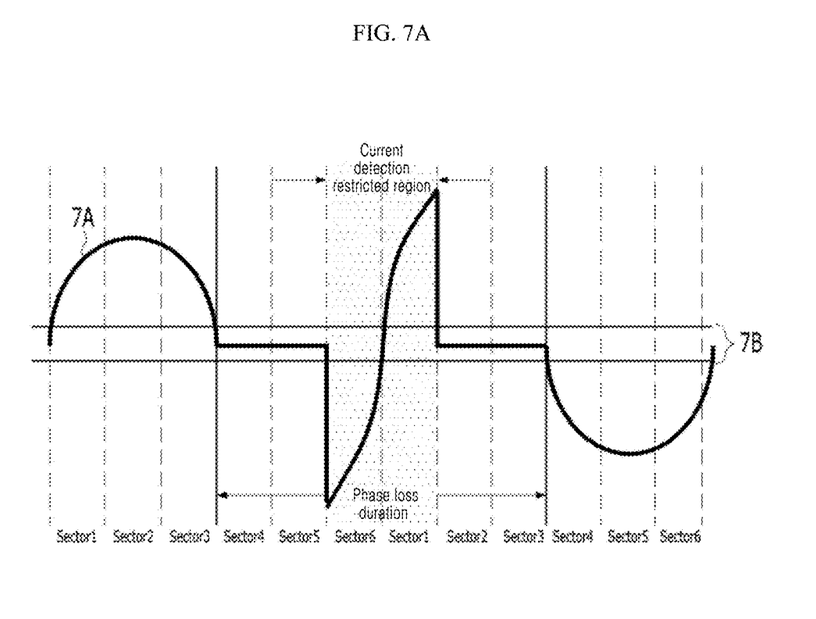
FIG. 7A and FIG. 7B show detection of phase loss in an output current detection scheme using a shunt-resistor.
Figure 7B:
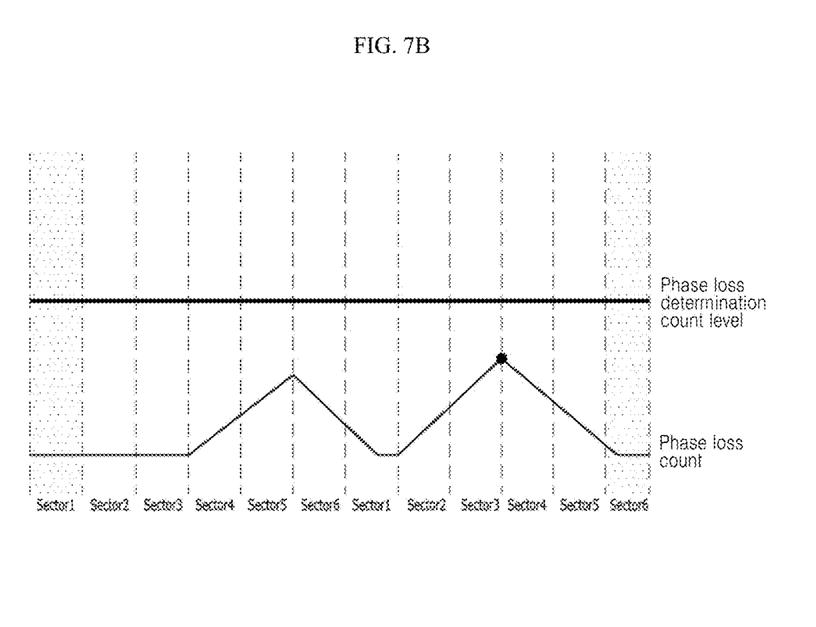

FIG. 7A and FIG. 7B show a scheme of detecting phase loss when an U phase output current is lost during one cycle in the output current detection scheme using a shunt-resistor.

Figure 8:
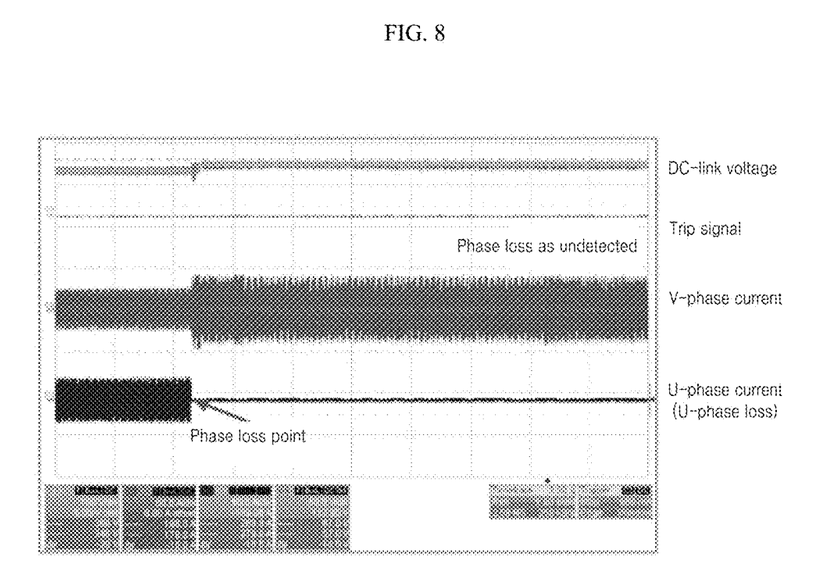
FIG. 8 shows that in the output current detection scheme using a shunt-resistor, phase loss of an output is not detected when an U phase current has phase loss actually.

In FIG. 7A, in a sector 2 to a sector 5 that a magnetic phase current of a U phase is detected, when the output current is within the current band corresponding to the output phase loss, the phase loss count is incremented. The phase loss count is decremented in a sector 1 and a sector 6 in which the U phase current is calculated using other phase currents, that is, V and W phase currents. Thus, the phase loss of the output in the phase loss sector cannot be detected. FIG. 8 shows that in the output current detection scheme using a shunt-resistor, the phase loss of an output is not detected when the U phase current has phase loss actually.

The present disclosure is intended to solve the above problems and to accurately detect the output phase loss in the inverter in the inverter output current detection scheme using the shunt-resistor.

Figure 9:
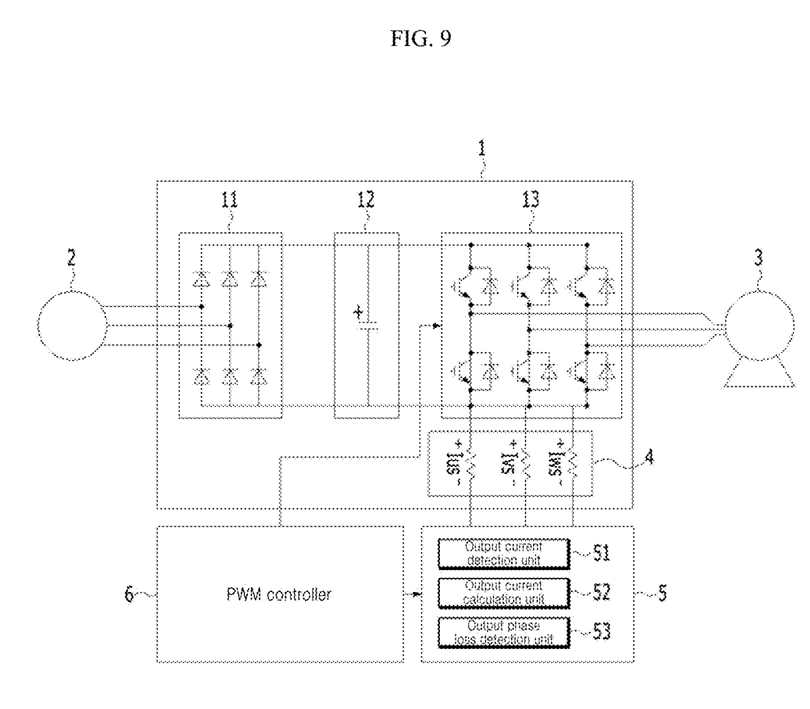
FIG. 9 is a block diagram of an inverter system to illustrate a device for detecting phase loss in an output of an inverter in accordance with an embodiment of the present disclosure.

FIG. 9 is a block diagram of an inverter system to illustrate a device for detecting phase loss in an output of an inverter in accordance with an embodiment of the present disclosure.

As shown in FIG. 9, the inverter system in accordance with one embodiment of the present disclosure receives commercial power from a power supply 2, converts the power into a power having a voltage of a magnitude and frequency adapted for the motor 3, and outputs the converted power to the motor.

The inverter 1 may include a rectifying module 11 for converting an AC voltage to a DC voltage, a DC link capacitor 12 for smoothing and storing the DC voltage, and an inverting module 13 for converting the DC link voltage into an AC voltage of a predetermined magnitude and frequency and outputting the converted AC voltage.

The inverting module 13 is composed of three phase legs, and each leg is constituted by two (lower and upper) switching elements. Each shunt-resistor 4 may be connected to a lower switching element of each leg. The device 5 for detecting the output phase loss according to one embodiment of the present disclosure receives information (output current information) related to the output current for each sector from each shunt-resistor 4, and receives sector information from a PWM controller 6, and detects currents of two phases from the output current information and sector information, and calculates a output current of one remaining phase using the currents of the two phases, and detect the output phase loss from the calculation results.

To this end, the device 5 for detecting an output phase loss according to one embodiment of the present disclosure may include an output current detection unit 51, an output current calculation unit 52, and an output phase loss detection unit 53.

The output current detection unit 51 may receive output current information from each shunt-resistor 4, receive sector information corresponding to the corresponding output current from the PWM controller 6, and detect output currents of two phases. The output current calculation unit 52 may calculate an output current of one phase from output currents of other two phases. The output phase loss detection unit 53 may receive the detected output currents and the calculated output current from the output current detection unit 51 and the output current calculation unit 52, respectively and then detect the phase loss of the output based on the detected output currents and the calculated output current. An operation of the output phase loss detection unit 53 will be described with reference to the drawings.

Figure 10A:
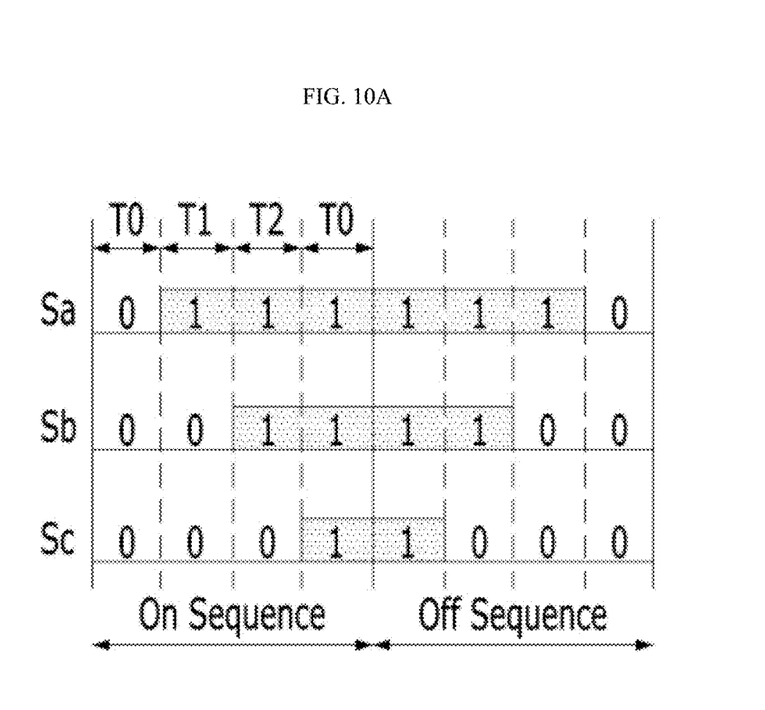
Figure 10B:
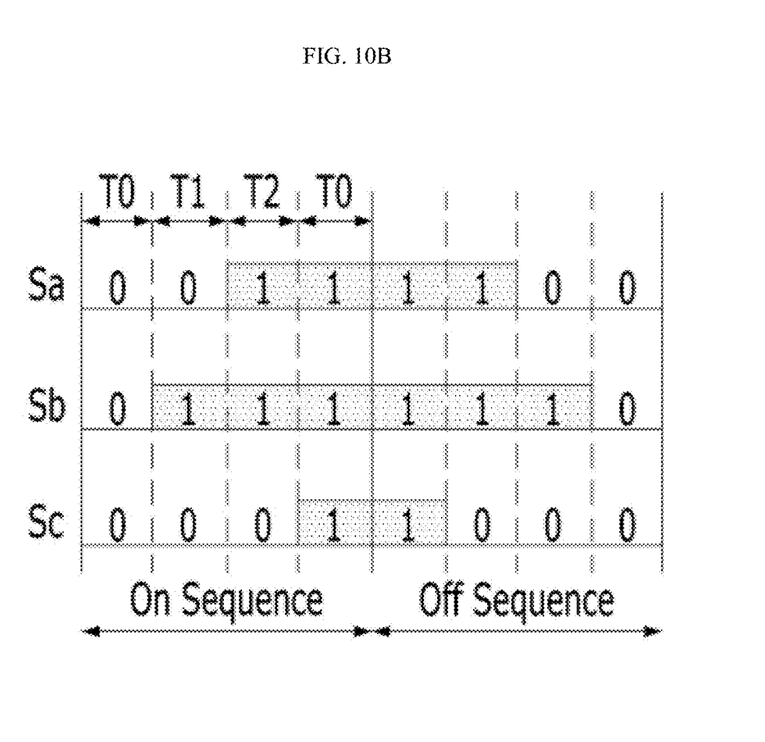
Figure 10C:
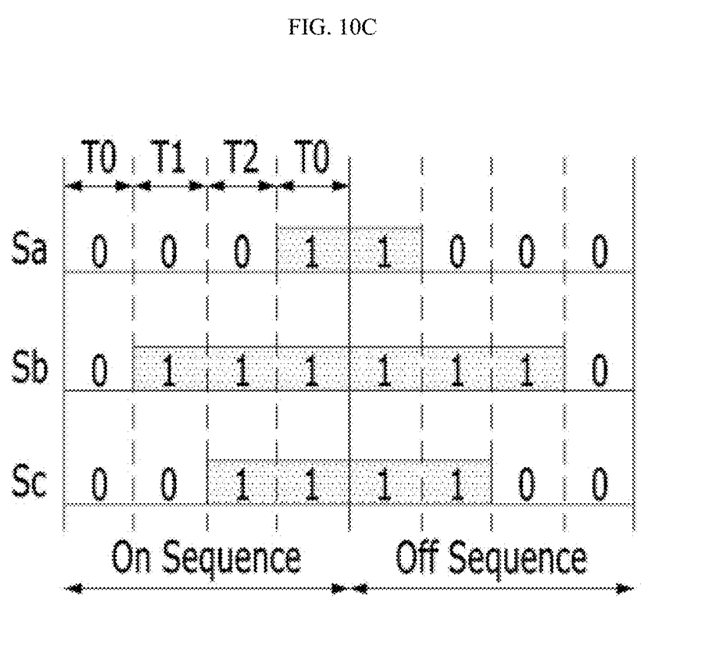
Figure 10D:
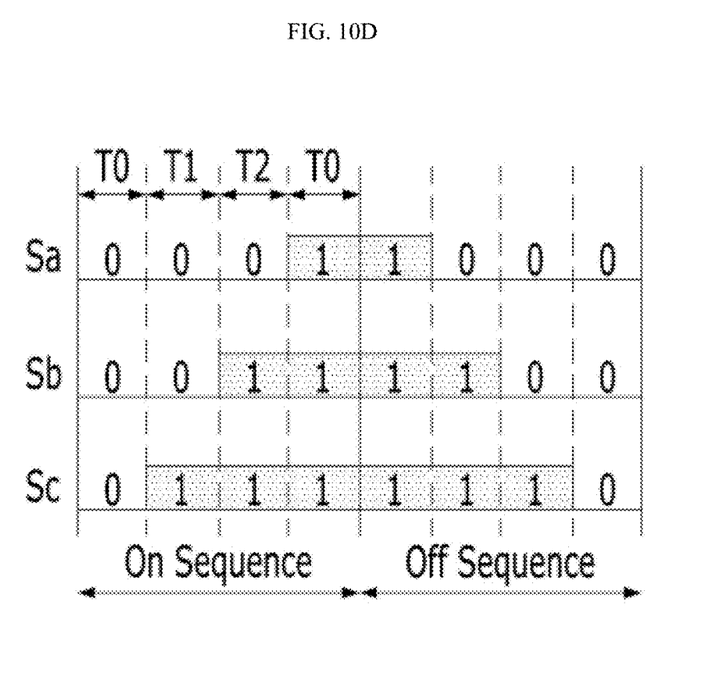
Figure 10E:
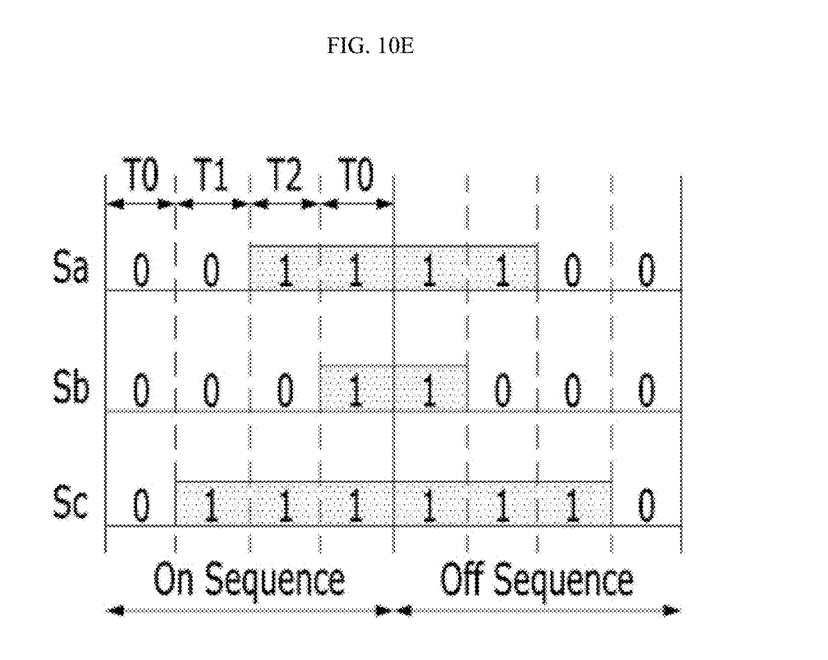
Figure 10F:
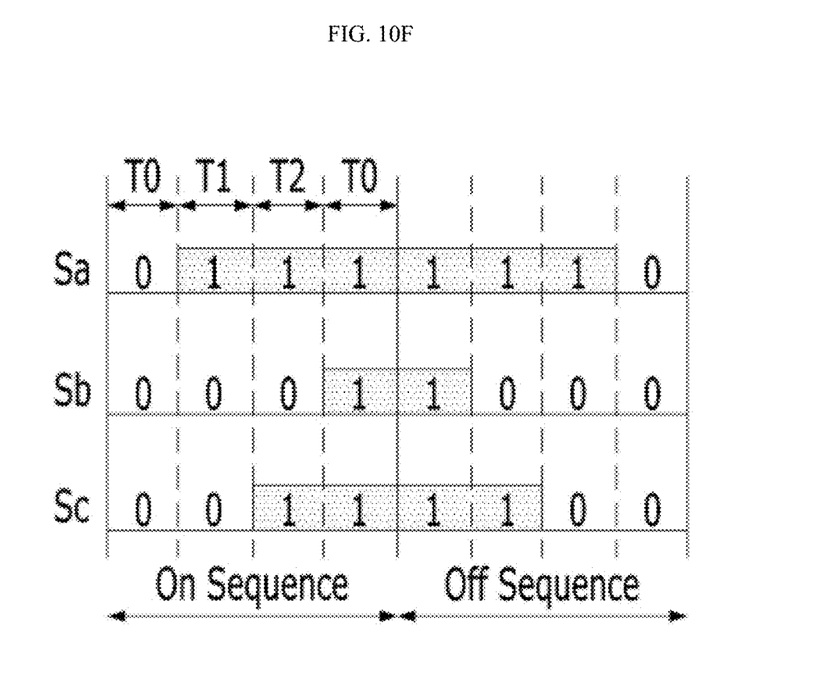

The PWM controller 6 provides a PWM control signal to a plurality of switching elements of the inverting module 13. FIG. 10A-F show an operation of switching elements for each PWM sector. That is, under A PWM control, the operation duration of the switching element may include a zero vector duration composed of a T0 duration, and active vector durations composed of T1 and T2 respectively. The switching elements of the inverting module 13 operates under this control. That is, the PWM controller 6 provides the PWM control signal to the switching elements of the inverting module 13 for each sector, and, then, based on the control signal, the inverting module 13 outputs an AC voltage of a predetermined magnitude and frequency to the motor 3. In one embodiment of the present disclosure, the PWM controller 6 may provide PWM sector information to the device 5 for detecting the output phase loss in accordance with the present disclosure.

Figure 11:
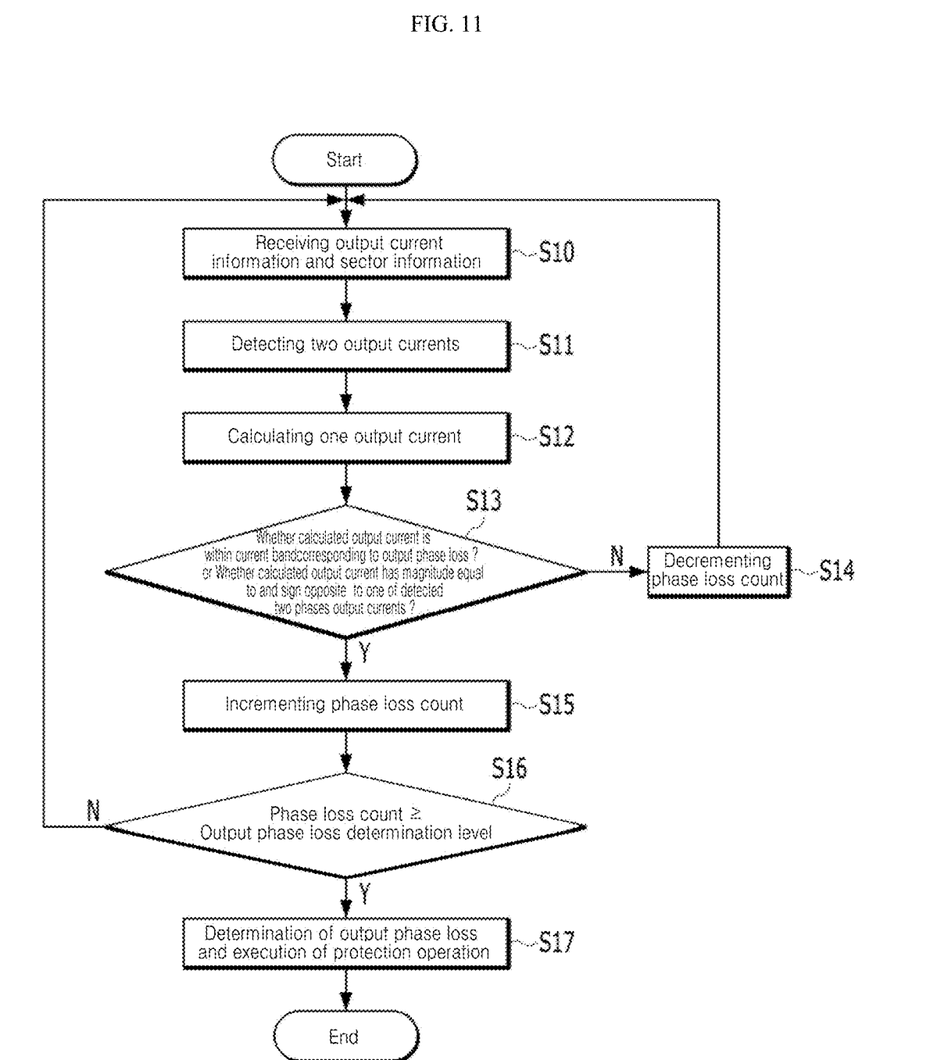
FIG. 11 is a flow chart illustrating a method of detecting phase loss in an inverter output current in accordance with one embodiment of the present disclosure.

FIG. 11 is a flow chart for illustrating a method for detecting the phase loss in the inverter output current in accordance with one embodiment of the present disclosure.

As shown in FIG. 11, in one embodiment of the present disclosure, the device 5 for detecting the output phase loss in accordance with the present disclosure receives the output current information of the inverter 1 from each shunt-resistor 4, and receives sector information corresponding to the output currents from the PWM controller 6 S10. However, in the embodiment of the present disclosure, an example that the sector information is received from the PWM controller 6 is set forth. The present disclosure is not limited to this configuration. The device 5 for detecting the output phase loss may detect the sector information from a operation state of the inverting module 13.

Then, the output current detection unit 51 detects output currents of two phases from the output current information S11. The output current calculation unit 52 calculates an output current of one remaining phase using the output currents of the two phases S12.

Thereafter, the output phase loss detection unit 53 may detect the output phase loss using the detected two-phase output currents (detected output currents) and the calculated one-phase output current (calculated output current) S13.

When an output phase loss occurs, the calculated output current is close to zero or has an opposite sign to and the same magnitude as one of the detected output currents of the other two phases. Specifically, a relationship between the detected two-phase output currents (detected output currents) and the calculated one-phase output current (calculated output current) is as follows. That is, in one embodiment of the present disclosure, when the output phase loss occurs, the calculated output current is not calculated as shown in Table 1, but, the calculated output current has an opposite sign to and the same magnitude as one of the detected output currents of the other two phases.

TABLE 2

| Sector Number | Calculated output current | U-phase loss | V-phase loss | W-phase loss |
|---|---|---|---|---|
| 1 | Iu | 0 | −Iw | −Iv |
| 2 | Iv | −Iw | 0 | −Iu |
| 3 | Iv | −Iw | 0 | −Iu |
| 4 | Iw | −Iv | −Iu | 0 |
| 5 | Iw | −Iv | −Iu | 0 |
| 6 | Iu | 0 | −Iw | −Iv |

That is, when, in the corresponding sector, the calculated output current is within the current band corresponding to the output phase loss, or the calculated output current has the same magnitude as and an opposite sign to one of the detected output currents, the output phase loss detection unit 53 may determine that the output phase loss occurs and increment the phase loss count S15. However, when the calculated output current is above or below the current band corresponding to the output phase loss, or the calculated output current is determined by the sum of the two detected output currents as shown in Table 1, the output phase loss detection unit 53 may decrement the phase loss count S14.

In one example, it may be assumed that any one phase in the output current in the sector 3 is lost. In the sector 3, the calculated output current is Iv, and, thus, the output phase loss detection unit 53 check the Iv. In this connection, when the calculated output current Iv has the same magnitude as and an opposite sign to Iw, that is, is equal to −Iw, the output phase loss detection unit 53 detects the U phase loss and increment the count. Then, when the calculated output current Iv is equal to −Iw, the count is accumulated until the sector is changed.

When the sector is changed to the sector 4, the calculated output current is Iw, and, thus, the output phase loss detection unit 53 check the Iw. In this connection, when the calculated output current Iw has the same magnitude as and an opposite sign to Iv, that is, is equal to −Iv, the output phase loss detection unit 53 detects the U phase loss and increment the count. Then, when the calculated output current Iw is equal to −Iv, the count is accumulated until the sector is changed.

When the accumulated count reaches a count level corresponding to an output phase loss determination, the output phase loss detection unit 53 determines the output phase loss event and performs the protection operation of the inverter 1 S17. The protection operation of the inverter 1 may be an output phase loss trip, but is not limited thereto.

In one embodiment of the present disclosure, for each sector, one phase current is calculated. Then, it is determined whether the calculated current is within the current band corresponding to the output phase loss. Further, at the same time, even when the calculated output current is above or below the current band corresponding to the output phase loss, it is further determined whether the calculated output current has an opposite sign to one of the other detected output currents and then it is further determined whether the output phase loss event occurs based on the determination. Thus, the quality of the inverter protection operation can be improved and the inverter and thus the load can be protected reliably, thereby improving the reliability of the inverter system.

Figure 12:
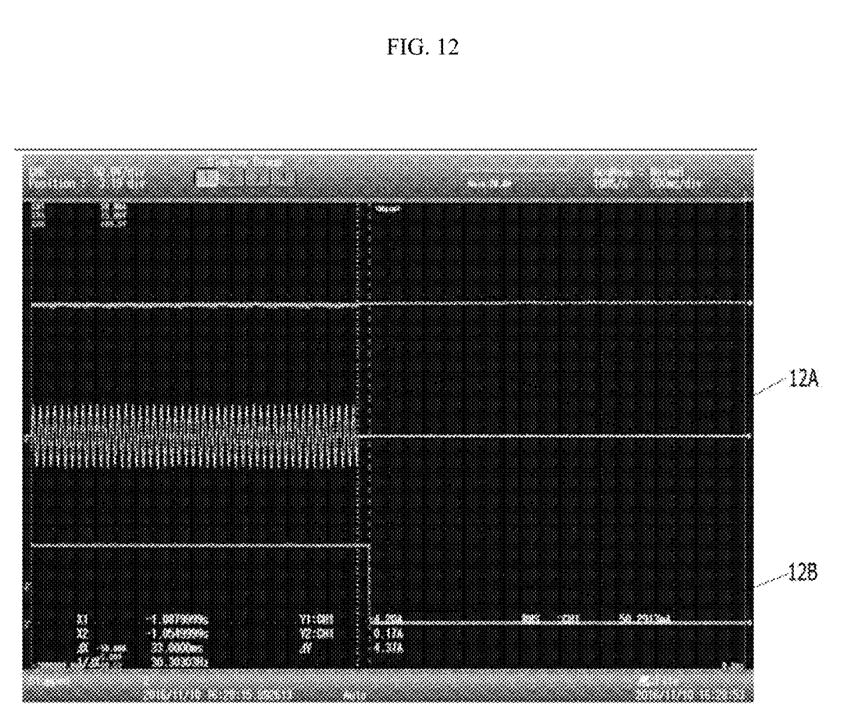
FIG. 12 is an example diagram to illustrate detection of phase loss in an output according to one embodiment of the present disclosure.

FIG. 12 is an example diagram to illustrate the detection of the output phase loss according to one embodiment of the present disclosure, in which the U phase is lost.

As shown in FIG. 12, when a phase loss occurs at a point 12A, the phase loss is detected in a different manner in the manner of FIG. 8, thereby to generate a trip 12B. Thus, the reliability of the inverter system can be improved.

It will be apparent to those skilled in the art that various modifications and variations may be made in the present invention without departing from the spirit of the present disclosure. The technical scope of the present disclosure is not limited to the contents described in the embodiments but should be determined by the claims and equivalents thereof.

What is claimed is:

1. A device for detecting a phase loss in an output current in an inverter,
   wherein the inverter includes:
   an inverting module for converting a direct current (DC) link voltage to an alternate current (AC) voltage, wherein the inverting module includes three-phases legs, wherein each leg has lower and upper switching elements connected in series; and
   a shunt-resistor connected in series with a lower switching element of each leg of the inverting module,
   wherein the device includes:
   an output current detection unit for detecting two phases output currents from two signals output from two shunt-resistors connected to two phases legs respectively;
   an output current calculation unit for calculating an output current of one remaining phase using the detected two phases output currents; and
   an output phase loss detection unit configured for detecting an output phase loss when the calculated output current is within a current band corresponding to the output phase loss or when the calculated output current has a magnitude equal to and a sign opposite to one of the detected two phases output currents.

2. The device of claim 1, wherein the output current detection unit receives sector information corresponding to the output currents from a pulse width modulation (PWM) controller, wherein the controller injects a PWM signal to the switching elements of the inverting module.

3. The device of claim 1, wherein when the calculated output current is within the current band corresponding to the output phase loss or when the calculated output current has a magnitude equal to and a sign opposite to one of the detected two phases output currents, the output phase loss detection unit is further configured to increment a phase loss count.

4. The device of claim 3, wherein when the calculated output current is above or below the current band corresponding to the output phase loss and when the calculated output current is equal to a sum of the detected two output currents, the output phase loss detection unit is further configured to decrement the phase loss count.

5. The device of claim 4, wherein when the phase loss count reaches a predetermined output phase loss determination level, the output phase loss detection unit is further configured to determine that an output phase loss event occurs and to perform an inverter protection operation.

* * * * *